United States Patent [19]

Goodwin

[11] Patent Number: 4,642,616
[45] Date of Patent: Feb. 10, 1987

[54] METHOD AND APPARATUS FOR DETECTION OF AC POWER FAILURE CONDITIONS

[75] Inventor: Peter A. Goodwin, Wayland, Mass.

[73] Assignee: Prime Computer, Inc., Natick, Mass.

[21] Appl. No.: 701,574

[22] Filed: Feb. 14, 1985

[51] Int. Cl.[4] ............................................. G08B 21/00
[52] U.S. Cl. .................................... 340/654; 307/413; 340/663; 340/664; 361/79
[58] Field of Search ............... 340/654, 662, 664, 661, 340/642, 663, 645, 644; 324/117 R, 253, 254, 255, 444; 179/175.3 F; 361/30, 65, 79; 307/413, 414; 323/358

[56] References Cited

U.S. PATENT DOCUMENTS

| | | | |
|---|---|---|---|
| 3,183,498 | 5/1965 | Midis et al. | 307/413 X |
| 3,187,225 | 6/1965 | Mayer | 361/79 |
| 3,546,476 | 12/1970 | Frase | 307/413 |
| 3,836,854 | 9/1974 | Wehman | 324/133 |
| 3,857,069 | 12/1974 | Howell | 361/79 X |
| 3,937,937 | 2/1976 | McVey | 235/153 R |
| 4,394,702 | 7/1983 | Boothe | 361/92 |
| 4,533,865 | 8/1985 | Schlenk | 324/51 |

FOREIGN PATENT DOCUMENTS

| | | |
|---|---|---|
| 0089048 | 9/1983 | European Pat. Off. |
| 2274981 | 1/1976 | France |
| 55-54321 | 6/1981 | Japan |
| 1488044 | 9/1976 | United Kingdom |

OTHER PUBLICATIONS

Electrical Design News, vol. 29, No. 16, Aug. 1984, p. 278, Boston, Massachusetts, US; D. Nelson: "Power-Line Monitor Produces Fast Response".

Primary Examiner—James L. Rowland
Assistant Examiner—Daniel Myer
Attorney, Agent, or Firm—Lahive & Cockfield

[57] ABSTRACT

An apparatus and method for detecting an AC power failure condition employs a fast attack, slow decay, energy storage circuit for tracking an AC input signal and for providing a slowly decaying output based upon a last received peak voltage input value. A current detection circuit monitors the current flow to the storage circuit from the AC mains and generates a current detection signal in response thereto. A power failure condition is declared when either the voltage across the energy storage circuit decays below a selected threshold value or current is not detected flowing to the energy storage circuit at a selected time. A particular current detection circuit employs a high permeability core which is saturated by a current in the sensed line having a current value below an expected peak current flowing to the energy storage circuit. An interrogation pulse periodically energizes an interrogation winding which, in the absence of current in the sensed line, induces a signal across an output winding. When the current being sensed is sufficient to saturate the core, no output signal is generated across the output winding. Circuitry monitors the voltage across the output winding and generates a conditioning signal when even a selected minimum current is not detected in the line at the time of the interrogation pulse.

12 Claims, 4 Drawing Figures

METHOD AND APPARATUS FOR DETECTION OF AC POWER FAILURE CONDITIONS

BACKGROUND OF THE INVENTION

The invention relates generally to a method and apparatus for recognizing an electrical power failure and, in particular, to a method and apparatus for detecting either a current or a voltage loss, which creates an electrical condition under which electrical circuitry might suffer irreversible adverse consequences if suitable countermeasures were not otherwise taken.

The detection of an AC power failure or outage is, for many classes of electrical equipment, an important and necessary function to prevent damage to the electrical components and to prevent loss of information stored by many electrical storage elements. Conventional apparatus have employed, for example, a low pass averaging circuit which, when the output decreases below a threshold level, triggers a failure response. This circuitry, while simple, has as its principal disadvantage substantial delay before the circuitry responds to an outage. In more recent applications, response time improvements have been achieved by the insertion of a frequency multiplier stage before the low pass filter. This permits the low pass filter to have a shorter time constant so that the delay between the power outage and the recognition thereof decreases.

Another conventional apparatus employs zero-crossing prediction which reduces the maximum delay to at most one-half cycle at the power frequency. Such a circuit, however, is insensitive to the voltage amplitude so that conditions of severe voltage reduction may not be detected even though the electrical equipment becomes dysfunctional.

Another method of recognizing a power failure utilizes a phase-locked-loop synchronized to the AC power frequency. A power outage is recognized if the loop drops out of a "lock" condition. This method introduces a detection delay due to the time constant of the low pass filter in the oscillator feedback loop. The filter is necessary for the circuit to be insensitive to random voltage transients.

There exist current measuring, power failure detection methods and apparatus. The measurement of current, however, is often associated with the undesirable insertion into a line of a relatively high loss circuit element, such as a resistor or plural diodes, across which a voltage measurement is made.

It is therefore an object of the present invention to detect a power outage including a "brown out" condition wherein there are severe voltage reductions. Other objects of the invention are a method and apparatus providing rapid response to a power outage, and a method and apparatus which are reliable and low in manufacturing cost. Further objects of the invention are a method and apparatus for measuring current flow which is reliable, low in cost, and has a low insertion loss. A further object of the invention is a method and apparatus which performs this detection while remaining safely isolated from hazardous electrical potentials on the conductor being monitored.

SUMMARY OF THE INVENTION

The invention relates to an AC power failure detection apparatus and features a fast attack, slow decay energy storage circuit for receiving an AC input signal and for providing a slowly decaying output signal based upon a last received peak voltage value. The apparatus further features a current detection circuit for detecting a flow of current to the storage circuit and for generating a detection condition in response thereto. A voltage threshold circuit provides a voltage failure condition signal when the decaying output of the storage circuit crosses a predetermined threshold voltage value, and a pulse-prediction circuit element provides a current failure signal upon the absence of the current detection condition. The apparatus thus detects both current and voltage and generates a failure condition signal when either the voltage or the current decreases from their expected value ranges.

In another aspect, the invention relates to a current detection circuit featuring a transformer element having a high permeability core, and having in circuit therewith a sense winding, an interrogation winding, and an output winding. The sense winding is also in circuit according to the illustrated embodiment with a storage circuitry, for passing through the winding, the current from an AC source to the storage circuitry. The sensed current is sufficient to saturate the core even at a current value substantially below the expected peak current value. An interrogation pulse source provides a periodic pulse interrogation signal to the interrogation winding for generating, in the absence of a saturating magnetic field in the core, a pulsed interrogation magnetic field. The output winding provides signals to a pulse generating circuit. The pulse generating circuit provides an output detection pulse in response to the timed occurrence of the interrogation pulse and an interrogation pulse generated signal developed across the output winding by the pulsed interrogation magnetic field. The output detection pulse signals the absence of adequate current in the sense winding to saturate the core. The current detection circuitry has very low insertion loss.

BRIEF DESCRIPTION OF THE DRAWINGS

Other objects, features, and advantages of the invention will appear from the following description taken together with the drawings in which.

DESCRIPTION OF PREFERRED PARTICULAR EMBODIMENTS

Figure 1:
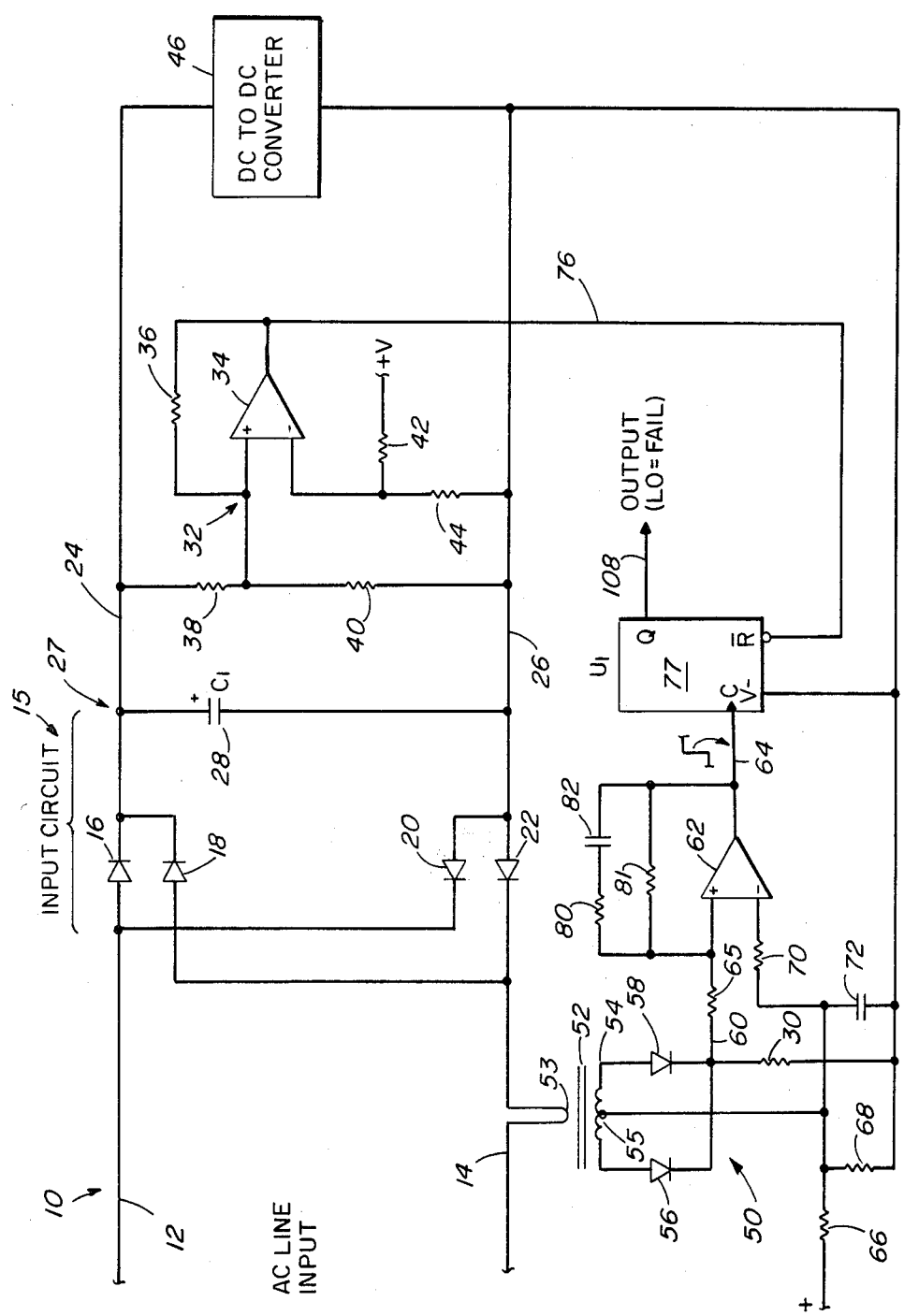
FIG. 1 is an electrical schematic diagram of a power failure circuit according to the invention.

Referring to FIG. 1, an AC power failure detection circuitry 10 receives an AC power input over lines 12, 14. The AC input passes through a full-wave rectifier input circuit 15 consisting of diodes 16, 18, 20, and 22. The output of the full-wave rectifier circuit is available over lines 24, 26. Connected across lines 24 and 26 is an energy storage capacitor 28. Further connected across the lines 24, 26, is a voltage threshold circuit 32 having a voltage comparator 34 with a hysteresis characteristic provided by a resistor 36. The positive input to the amplifier 34 is a signal derived by a series resistor divider network having resistors 38 and 40. The negative input of the amplifier receives a fixed reference voltage threshold signal from the output of a series resistor network having resistors 42 and 44. One side of resistor 42 is connected to a positive voltage V. Further connected across the lines 24 and 26 is a load circuitry 46 which, in the illustrated embodiment, is a DC-to-DC converter. The DC-to-DC converter draws power from the energy storage capacitor 28.

A current detection circuitry 50 detects the flow of current along conductor 14 using a transformer coupling arrangement. A transformer 52 has its primary winding 53 in series circuit with line 14. A secondary winding 54 is center-tapped at 55. Resistor 30 loads the current transformer and provides the necessary scaling factor between observed voltage and current measured. Diodes 56 and 58 full wave rectify the current signal and provide a unipolar output over a line 60. The current detection circuitry 50 employs a voltage comparator 62 connected so as to provide a fast switching response at its output over a line 64. The comparator receives the unipolar signal on line 60 at its positive input terminal through a resistor 65. The negative input terminal of the amplifier 62 receives a fixed current reference threshold voltage from the circuitry composed of resistors 66 and 68 via stabilizing resister 70. Capacitor 72, with resistor 66, filters any residual noise from the reference voltage presented to resistor 70. Feedback resistor 80 and capacitor 82 in the positive feedback loop degrade response to fast-rise input signals through resistor 65, making comparator 62 relatively insensitive to noise impulses received from main input line 14 via transformer 52. Feedback resistor 81 establishes DC hysteresis in comparator 62. The output of the comparator 62 drives an edge triggered, retriggerable one-shot multivibrator 77. The retriggerable one-shot multivibrator acts as a pulse omission detector, and provides an output change upon the absence of a pulse signal as described in more detail below. The mulitvibrator 77 also has an overriding reset input which receives an input signal from comparator 34 over a line 76. In this illustrated embodiment, if the output of multivibrator 77 is low, a failure condition is detected.

Figure 2:
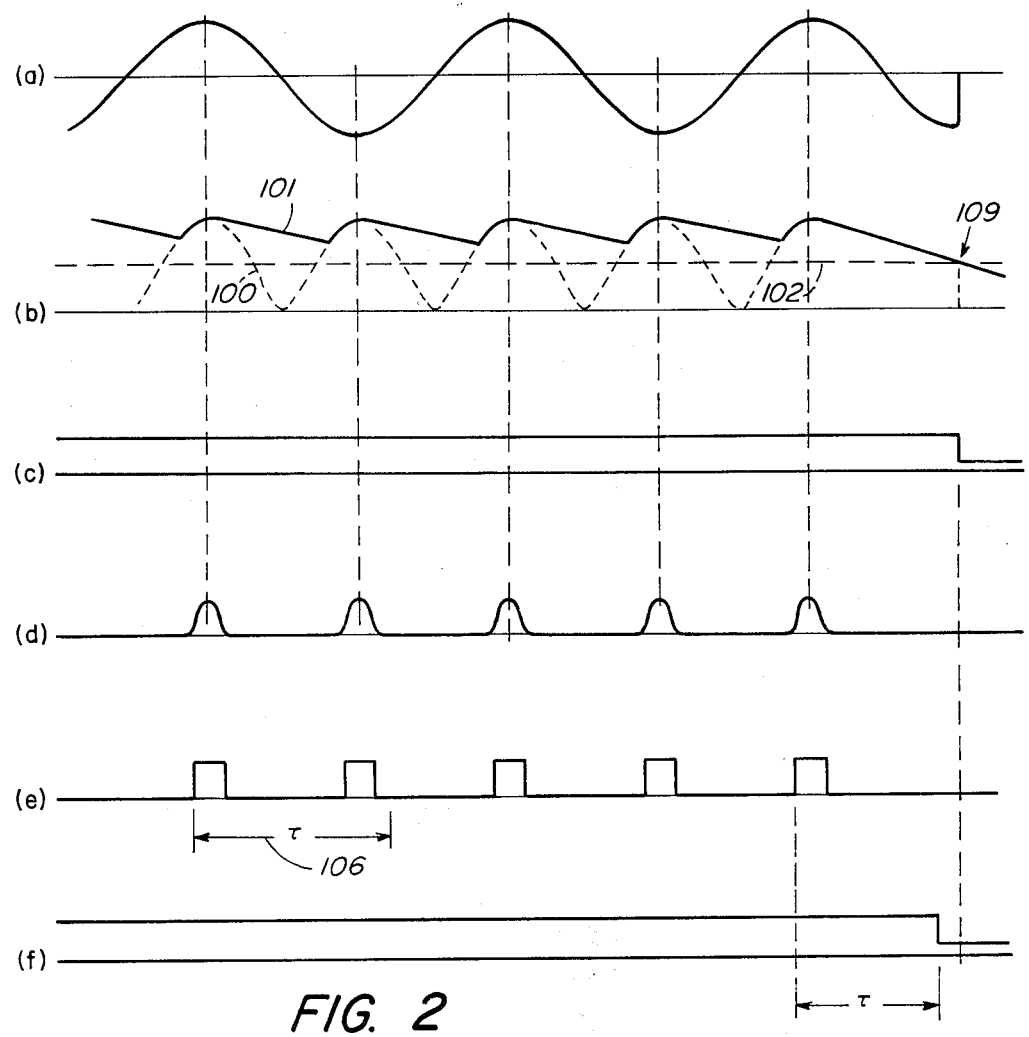
FIG. 2 illustrates several waveforms in a typical operation of the circuit of FIG. 1.

In operation, the input AC source signal appearing between lines 12 and 14, (and referring to FIG. 2,) can be a fifty or sixty Hertz signal of appropriate voltage and has the general shape shown in line (a) of FIG. 2. The AC input signal is full-wave rectified by the diode circuit and produces, in the absence of the energy storage capacitor 28, a dotted line signal 100 of FIG. 2, line (b). The energy storage capacitor 28, however, stores charge as the voltage increases so that the actual signal appearing between lines 24 and 26 is the solid line signal 101 of FIG. 2, line (b). The storage capacitor 28 thus represents a fast attack (voltage builds up quickly), slow decay (voltage (charge) drains off slowly) network. During the time when the capacitor 28 is effectively isolated from the input AC mains because diodes 16, 18, 20, and 22 are reverse-biased since the instantaneous magnitude of the AC input voltage is less than the terminal voltage of capacitor 28, the load 46 draws current from the capacitor 28 and no current passes on lines 12 or 14.

The comparison circuit 32 monitors the voltage across lines 24, 26. The negative input of the operational amplifier 34 receives a scaled threshold voltage, for example corresponding to that shown as dashed line 102 of FIG. 2, line (b). The voltage divider 38, 40 scales the potential difference between lines 24 and 26 so that when the voltage at the positive input of amplifier 34 drops below the selected threshold value, an insufficient-average-voltage condition is indicated by the output of the comparator changing from a logic-high to a logic-low state at that time, thereby producing the required actuating reset signal to multivibrator 77 over line 76. This corresponds to line (c) in FIG. 2.

The current detection circuitry 50 provides, on line 60, a signal corresponding to the current flowing in line 14. The signal on line 60 is full wave rectified and appears as shown in line (d) of FIG. 2. Note that current flows only when the input voltage crests, and that the current peak corresponds to the crests of the AC power input voltage. The current pulses on line 60 are squared up by comparator 62 and its associated circuitry, and the amplifier output over line 64 corresponds to the repetitive pulse signal at line (e) of FIG. 2. The repetitive pulse signal over line 64 triggers the retriggerable one-shot multivibrator 77 which has a time-out duration between ½F and 1/F where F is the frequency of the input signal. Referring to FIG. 2, line (e), this duration can correspond to the time duration 106. If the time duration is chosen carefully, the same circuitry can be used for both fifty and sixty Hertz AC inputs without a change of components. For example, the duration can equal 12.5 milliseconds.

The output of the retriggerable multivibrator 77, corresponding to line (f) of FIG. 2, is the failure detect signal over line 108. A high output signal indicates that the circuitry is working properly while a low output signal indicates that the power failure condition has occurred. Note, for example, that in the illustrated embodiment, the output signal can be low prior to the time when the voltage detection signal is low at 109. This occurs because of the absence of a current pulse signal on line 60. The retriggerable multivibrator thus acts as a current threshold circuit for detecting a current failure by the absence of an expected current pulse over line 64.

The circuitry of FIG. 1 is also effective for detecting a brown out condition wherein the AC voltage decreases but current is nevertheless continuously drawn at a periodic rate from the source. In this instance, pulses on line (d), and hence line (e) will continue to be present although, with regard to the signal pulses over line (d), at a possibly decreased amplitude. However, the voltage threshold circuitry will detect a power failure, causing the retriggerable multivibrator to be reset by the signal over line 76. The circuitry then provides a power failure condition output over line 108. Similarly, the long-term average of the AC input voltage may be sufficient to maintain the voltage across lines 24, 26 above the threshold value 102, but there may be a current failure instead. This can occur when, during any cycle of the AC input voltage, the voltage drops suddenly, but not below a threshold value; however, the current drawn through line 14 will be zero because the voltage on capacitor 28 is not exceeded by the input voltage. Under this circumstance, the absence of a current pulse on line 60 (corresponding to FIG. 2, line (d)) will cause the multivibrator to "time out," and produce a failure condition signal level over line 108.

Figure 3:
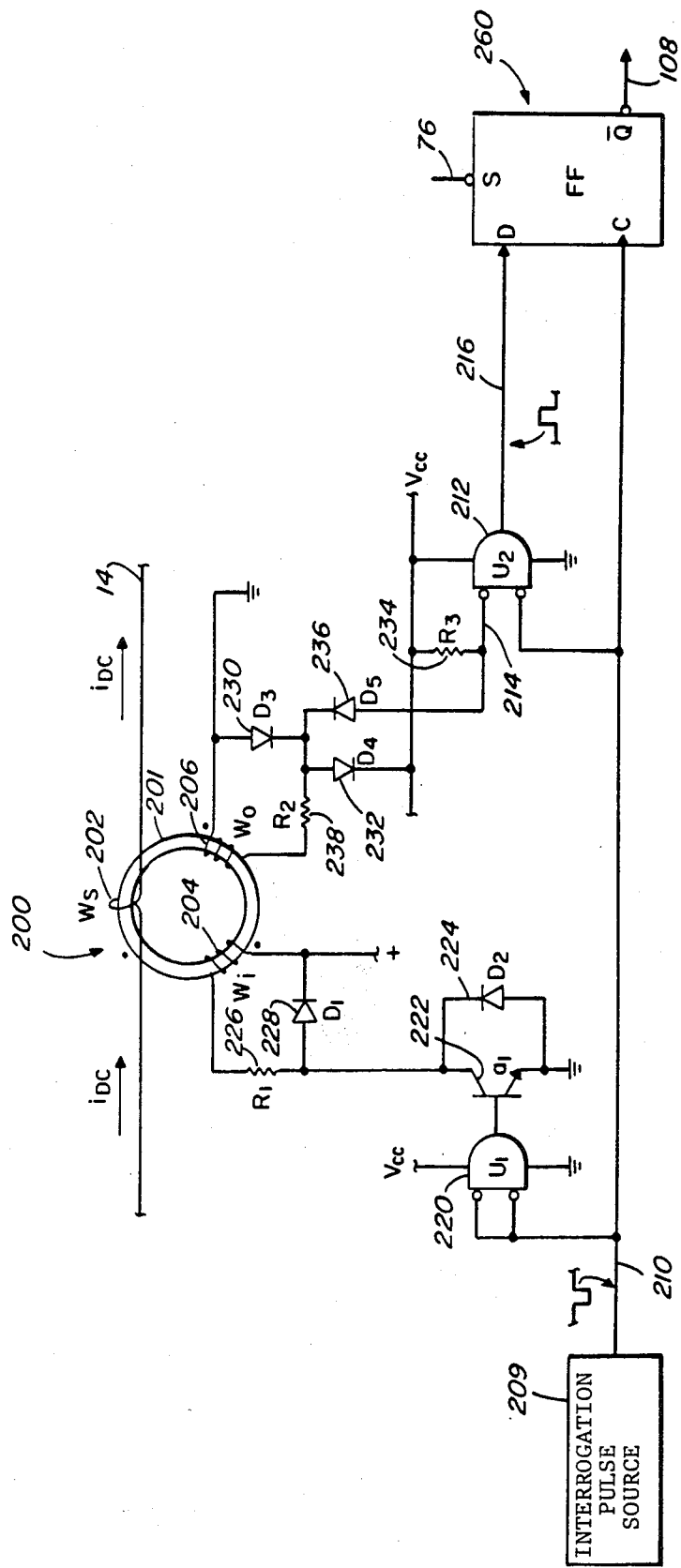
FIG. 3 is an electrical schematic diagram of a particularly preferred current detection circuit according to the invention.

In an alternate embodiment of the invention, referring to FIG. 3, the current detection circuitry of FIG. 1 can be replaced by a transformer 200 and associated circuitry using a few gates, diodes, and a transistor. In this alternate circuit, transformer 200 consists of a core 201, a sense winding 202, an interrogation winding 204, and an output winding 206. Each winding has the polarity shown in FIG. 3. The core 201 is preferably a high-permeability tape-wound core.

Sense winding 202 has a sufficient number of turns so that the transformer core can be saturated at a relatively small current, that is, for the application herein, by a current (on line 14) which is approximately twenty-five percent of the expected peak value of current to be drawn through the line. Thus, in operation, the sensed current on line 14, if present, saturates core 201. An applied interrogation pulse, from an interrogation pulse source 209, over a line 210, causes current to flow in interrogation winding 204. The interrogation pulse is generated in synchronism with the expected current pulse over line 14 and in the absence of the current on line 14, creates a magnetic field in the core which would reinforce or add to the flux in the core 201 had a small current been flowing in line 14. However, if a normal current is flowing in line 14, the interrogation pulse generated field has no effect since the current on line 14 has already saturated core 201. This occurs because there is essentially no increase in flux in the core after saturation occurs. The output winding 206 thus sees no change in flux and hence provides no output voltage drop thereacross. The output of a gate 212 then remains low and provides no indication of a power failure. Conversely, if there were no current flowing in the sense winding 202, or if the current were sufficiently small that the core was not saturated, the current in the interrogation winding 204 would effect an increase in core flux, which would induce a voltage in the output winding 206, which would cause the input over a line 214 of gate 212 to go low. At the same time, the low input of the interrogation pulse on line 210 effects a high output signal on the sense output line 216, thereby indicating a power failure condition due to a lack of sufficient current on line 14. The signal over line 216 can be applied to a flipflop 260 for recording the power failure condition and for providing the failure detected level over an output line 108 (corresponding to line 108 of FIG. 1). The flipflop 260 can also be conditioned by the signal over line 76 from amplifier 34 (FIG. 1).

In operation, the interrogation pulse 210 is input to both inputs of a negative input NAND gate 220. The output of the NAND gate drives a transistor 222, protected by a diode 224, and causes a current to flow in the winding 204 during the interrogation time defined by the low value of the interrogation signal. The current is limited by a resistor 226 and a diode 228 protects the transistor 222 when current flows in the sense winding and the transistor is being turned off. Diode 224 protects the transistor when the sense winding is initially energized by the current being monitored.

The resulting induced voltage in the output winding (when the core is not saturated) forces the input voltage on line 214 to a logic-low value, thereby enabling the gate 212. (The other input of gate 212 receives the already low interrogation pulse.) In the illustrated embodiment, the interrogation pulse over line 210 thus conditions gate 212 so that stray voltages appearing across the output winding are ineffective except during the interrogation time.

Diodes 230 and 232 protect gate 212 from input voltages greater than $V_{cc}$ or more negative than logic ground. A resistor 234 biases the input over line 214 high (false) unless a voltage is developed across the output winding, through a diode 236, driving it low (true). A resistor 238 limits the diode current and determines the "core-reset" voltage developed across the output winding.

The resulting circuitry thus detects an AC power failure using novel current detection circuits wherein the power failure can result either from a loss of voltage or current. In particular, the current detection apparatus and method need only detect current at scheduled predetermined and preferably periodic times. Thus the current signal duty cycle can be significantly less than fifty percent.

While the current detection circuitry of FIG. 3 can effectively operate within the application of FIG. 1 only if the interrogation pulses over line 210 are in timed in synchronism with the crests of the AC voltage, other uses of the particular current sensing circuitry of FIG. 3 can be made in either AC or DC circuit applications.

Figure 4:
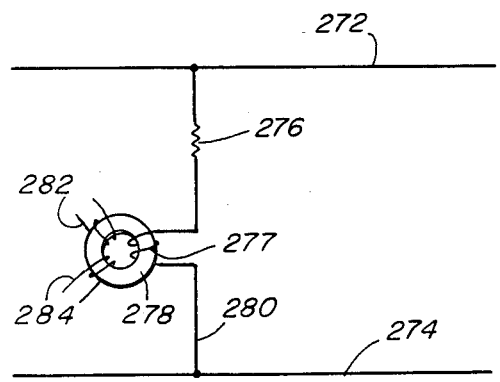
FIG. 4 is an electrical schematic diagram of the use of the current detection circuit, according to the invention, for detecting the presence of a voltage across two lines.

Referring to FIG. 4, the current detection circuitry of FIG. 3 can also be employed for detecting or sensing a voltage across lines 272 and 274. A sensing circuit, connected across the lines 272 and 274, includes a current limiting resistor 276 and a sense winding 277 wound on a transformer core 278 connected in accordance with the circuit diagram of FIG. 3. The presence of a sufficient DC current, indicating the presence of a minimum voltage between lines 272 and 274, will saturate core 278. The absence of a voltage, or a voltage below the selected minimum value, decreases the current in line 280 below an acceptable value and fails to saturate the high permeability core 278. The detection operation illustrated schematically by an interrogation winding 282 and an output winding 284 is the same as that described in connection with FIG. 3. The circuitry can also be employed with an AC voltage signal across lines 272 and 274 by providing a full or half-wave rectification in the circuit composed of resistor 276 and winding 277 so that the current in the sense winding 277 flows in only one direction.

Additions, subtractions, deletions, and other modifications of the described illustrated embodiments will be apparent to those practiced in the art and are within the scope of the following claims.

What is claimed is:

1. Apparatus for detecting an AC power failure condition comprising
    a fast attack, slow decay energy storage circuit means for receiving an AC input signal and for providing a slowly decaying output based upon at last received peak voltage value,
    a voltage threshold means for providing a voltage failure condition signal when the decaying output of said storage circuit means crosses a predetermined threshold voltage value,
    a current detection circuit for detecting a flow of current to said storage circuit means, said current detection circuit including means for generating a current detection condition signal in response to said detection of said flow of current, and
    a pulse-prediction circuit for providing a current failure signal upon the absence of said detection of said flow of current.

2. The apparatus of claim 1 wherein said current detection circuit comprises
    a transformer element having a high-permeability core,
    a sense winding in circuit with said storage circuit and said core for passing therethrough current from said AC source to said storage circuit, said current being sufficient to saturate said core at a current value below an expected peak current value, an interrogation pulse source for periodically generating interrogation pulses, an interrogation winding in circuit with said core for generating, in the absence of a magnetic field in said core, an interrogation magnetic field in response to said interrogation pulse, an output pulse generation circuit, and an output winding in circuit with said core and said pulse generating circuit, said pulse generation circuit providing an output detection pulse in response to an interrogation pulse generated signal developed across said output winding.

3. The apparatus of claim 2 wherein said pulse generation circuit includes means for providing an output detection pulse in response to a timed occurrence of a said interrogation pulse and said interrogation pulse generated signal developed across said output winding.

4. The AC power failure apparatus of claim 1 wherein said current detection circuit further comprises means for detecting a periodic flow of current to said storage circuit and for generating a periodic pulse signal output representing a detection condition in response thereto, and said pulse-prediction circuit further comprises means for providing a current failure signal upon the absence of a said periodic pulse output from said current detection circuit.

5. The AC power failure detection apparatus of claim 1 wherein said current detection circuit comprises a transformer coupled current sensing circuit, said sensing circuit comprising means responsive to said sensed current for providing a periodic pulse signal corresponding to periodic sensed current flowing to said storage circuit, and said pulse-prediction circuit comprises a pulse omission circuit for providing an output signal change when a said periodic pulse from said sensing circuit is absent.

6. The apparatus of claim 5 wherein said pulse omission circuit comprises a retriggerable multivibrator.

7. The apparatus of claim 6 further wherein said multivibrator has an overriding reset input, and including means for connecting said voltage failure condition signal to said reset input, said multivibrator including means responsive thereto for resetting said multivibrator during a voltage power failure condition.

8. The apparatus of claim 1 wherein said energy circuit means comprises a capacitor.

9. The apparatus of claim 1 further comprising means for full-wave rectifying said input voltage for delivery to said energy storage circuit means, said rectifying means further isolating said energy storage circuit means when the input AC voltage is less than a predetermined energy circuit voltage.

10. Apparatus for detecting an AC power failure condition comprising a full wave rectification circuit for full wave rectifying an AC input source signal, a capacitive energy storage circuit for receiving the full wave rectified AC input signal and for providing a slowly decaying output based upon a last received peak voltage value, a voltage threshold circuit for providing a voltage failure condition signal when the decaying output of the storage circuit crosses a predetermined threshold voltage value, a transformer coupled current detection circuit for detecting a flow of current to the capacitive storage circuitry and for generating an electrical signal indicating the presence of a current being supplied to the storage circuit, a retriggerable multivibrator circuitry responsive to the current detection circuit for providing a first signal level output indicating a continuing periodic flow of current to said capacitive energy storage circuit and for providing a second signal level output in the absence of a said continuous periodic flow of current to said energy circuit, and means responsive to the voltage failure condition signal for resetting said multivibrator to said second signal level output during a voltage failure condition.

11. A method for detecting an AC power failure condition comprising the steps of tracking an AC input signal using a fast attack, slow decay energy storage element, providing a decaying output signal based upon a last received peak voltage value of said AC input signal, detecting a flow of current to said storage element, generating a current detection condition signal in response to said detected flow of current, providing a voltage failure signal when the decaying output of said storage element crosses a predetermined threshold, and providing a current failure signal upon the absence of said current detection condition.

12. The method of claim 11 wherein said detecting step further comprises the steps of generating a saturating magnetic flux in a high permeability magnetic core in response to a current value less than a peak expected value of the current passing from the AC source to the storage element, generating an interrogation signal for creating, in the absence of a saturated core, a magnetic flux in said core, and generating said current failure signal upon the occurrence of said interrogation pulse when said core is not in a saturated flux condition.

* * * * *